United States Patent
Zhou et al.

(10) Patent No.: US 8,816,340 B2
(45) Date of Patent: Aug. 26, 2014

(54) ORGANIC ELECTROLUMINESCENCE DEVICE AND MANUFACTURING METHOD THEREOF

(75) Inventors: Mingjie Zhou, Shenzhen (CN); Ping Wang, Shenzhen (CN); Hui Huang, Shenzhen (CN); Xiaoming Feng, Shenzhen (CN)

(73) Assignee: Ocean's King Lighting Science & Technology Co., Ltd., Shenzhen (CN)

( * ) Notice: Subject to any disclaimer, the term of this patent is extended or adjusted under 35 U.S.C. 154(b) by 0 days.

(21) Appl. No.: 13/823,450

(22) PCT Filed: Sep. 30, 2010

(86) PCT No.: PCT/CN2010/077511
§ 371 (c)(1),
(2), (4) Date: Mar. 14, 2013

(87) PCT Pub. No.: WO2012/040928
PCT Pub. Date: Apr. 5, 2012

(65) Prior Publication Data
US 2013/0181207 A1    Jul. 18, 2013

(51) Int. Cl.
*H01L 51/50* (2006.01)
*H01L 51/56* (2006.01)

(52) U.S. Cl.
USPC ............................................. 257/40; 438/99

(58) Field of Classification Search
CPC .................................................. H01L 51/0026
See application file for complete search history.

(56) References Cited

U.S. PATENT DOCUMENTS 8,268,193 B2 * 9/2012 Uetani .......................... 252/500

FOREIGN PATENT DOCUMENTS

CN        101176219 A    5/2008

OTHER PUBLICATIONS

International Search Report of corresponding application International No. PCT/CN2010/077511, mailed on Jul. 7, 2011.

* cited by examiner

*Primary Examiner* — Stephen W Smoot
(74) *Attorney, Agent, or Firm* — Hoffmann & Baron, LLP

(57) ABSTRACT

An organic electroluminescence device comprises the following structure: a conductive base (110), a hole injection layer (120), a light emission layer (140), and a cathode layer (170) are laminated in sequence. The material of the hole injection layer (120) comprises a conductive polymer and an azo initiator. A nano-network structure is provided on the connecting surface of the hole injection layer (120) and the light emission layer (140). After being heated to a higher temperature, the azo initiator can be decomposed to release $N_2$, thus the nano-network structure is formed on the surface of the hole injection layer (120). The nano-network structure can efficiently increase the contacting area of the hole injection layer (120) and the adjacent layer. The injection efficiency of the hole is improved. A manufacturing method of the organic electroluminescence device is also provided.

13 Claims, 2 Drawing Sheets

ORGANIC ELECTROLUMINESCENCE DEVICE AND MANUFACTURING METHOD THEREOF

CROSS-REFERENCE TO RELATED APPLICATIONS

This application is a national stage filing of International Application No. PCT/CN2010/077511, filed on Sep. 30, 2010, the entirety of which is incorporated herein by reference.

TECHNICAL FIELD

The present invention relates to the field of organic electroluminescence, and, in particular, relates to an organic electroluminescent device and a method for preparing the same.

BACKGROUND

Organic electroluminescent devices, also known as organic light emitting diodes (OLEDs), are a type of devices which can directly convert electric energy to light energy. In 1987, C. W. Tang and collaborators first prepared a small-molecular organic electroluminescent device having a double-layer structure by using a hole transport material N,N'-diphenyl-N,N'-bis(3-tolyl)-4,4'-benzidine as a hole transport layer, and 8-hydroxyquinoline aluminum having electron transport capacity as an electron transport layer and a light-emitting layer.

Organic electroluminescence may involve the following five processes: 1) injection of carriers, during which electrons and holes are injected from the cathode and the anode, respectively, to the organic functional film layer arranged between the electrodes under the effect of an applied electric field; 2) migration of carriers, during which the injected electrons and holes migrate to the light emitting layer from the electron transport layer and the hole transport layer, respectively; 3) recombination of carriers, during which electrons and holes combine in the light-emitting layer to produce excitons; 4) migration of excitons, during which excitons migrate under the effect of the electric field, transfer their energy to the luminescent molecules, and excite electrons to transit from ground state to excited state; and 5) electroluminescence, during which the excited state is deactivated through energy irradiation to generate photons and release energy.

In these five processes, the energy-level match between the layers is very important, which directly affects the ultimate performance of the device. The HOMO value of the hole transport layer material is somewhat different from that of the anode material and the anode may release oxygen after long-time operation, which destroys the organic layer and results in dark spots. Therefore, a hole injection layer, which has a HOMO value between those of the anode and the hole transport layer, is normally inserted between the anode and the hole transport layer to facilitate hole injection. In addition, its film characteristics enable it to prevent oxygen in the anode from entering the OLED device, so as to prolong the life time of the device. Furthermore, the hole injection layer can also increase the adhesiveness of the hole transport layer and the anode, increase the hole injection contact, balance electron and hole injections, increase the proportion of exciton production from electron and hole, and control or reduce the number of holes which do not participate in light emission, thereby increasing the efficiency of the device. In conventional organic electroluminescent devices, due to the low contact area between the hole injection layer and an adjacent layer, the contact is poor, which results in reduction of hole injection efficiency, thereby affecting the luminescent efficiency and the luminescent brightness of the organic electroluminescent device.

SUMMARY

In view of the above, it is necessary to provide an organic electroluminescent device with relatively high luminescent efficiency and luminescent brightness.

An organic electroluminescent device comprises a sequentially laminated structure comprising a conductive substrate, a hole injection layer, a light emitting layer and a cathode layer; wherein the hole injection layer comprises a conductive polymer and an azo initiator, and the surface of the hole injection layer connecting to the light emitting layer has a nano-reticular structure formed by thermal decomposition of the azo initiator.

Preferably, the azo initiator is oil-soluble azobisisobutyronitrile, and the conductive polymer is poly(3-hexylthiophene), poly(3-methylthiophene), poly(3-octyloxythiophene) or poly(3-dodecylthiophene).

Alternatively, the azo initiator is water-soluble azobis(isobutyramidine) hydrochloride, azobis[2-(2-imidazolin-2-yl)isobutane]hydrochloride, azobis(cyanovaleric acid) or azobis[2-(2-imidazolin-2-yl)propane], and the conductive polymer is a mixture of poly(3,4-ethylenedioxythiophene) and poly(sodium-p-styrenesulfonate) in a mass ratio of from 1:2 to 1:6.

Alternatively, the azo initiator is amphipathic azoisobutyronitrile formamide, and the conductive polymer is a mixture of poly(3,4-ethylenedioxythiophene) and poly(sodium-p-styrenesulfonate) in a mass ratio of from 1:2 to 1:6, poly(3-hexylthiophene), poly(3-methylthiophene), poly(3-octyloxy thiophene) or poly(3-dodecyl thiophene).

Preferably, the organic electroluminescent device further comprises a hole transport layer between the hole injection layer and the light emitting layer, and the surface of the hole injection layer connecting to the light emitting layer has a nano-reticular structure formed by thermal decomposition of the azo initiator.

Preferably, the organic electroluminescent device further comprises an electron transport layer or an electron injection layer between the light emitting layer and the cathode layer.

Preferably, the organic electroluminescent device further comprises an electron transport layer and an electron injection layer between the light emitting layer and the cathode layer, and the electron transport layer is in contact with the light emitting layer.

In addition, there is a need to provide a method for preparing the organic electroluminescent device described above.

A method for preparing an organic electroluminescent device comprises the steps of: adding an azo initiator into a solution of a conductive polymer and stirring to prepare a conductive gel, wherein a mass ratio of the azo initiator and the conductive polymer is in a range of from 0.1:1 to 1.5:1;

subjecting a surface of a conductive substrate to a pretreatment;

spin-coating the conductive gel on the pretreated surface of the conductive substrate and drying to give a hole injection layer;

providing a light emitting layer on the hole injection layer; and providing a cathode layer on the light emitting layer and drying to give the organic electroluminescence device.

Preferably, the azo initiator is oil-soluble azobisisobutyronitrile, the conductive polymer is poly(3-hexylthiophene), poly(3-methylthiophene), poly(3-octyloxy thiophene) or poly(3-dodecyl thiophene), the solvent for the solution of the conductive polymer is toluene, chlorobenzene or xylene, and the step of spin-coating the conductive gel and drying comprises dripping the conductive gel on the conductive substrate, spin coating with a spin coater at a rotating speed of 500~4000 rpm, and heating at 150~200° C. for 15~60 min.

Preferably, the azo initiator is water-soluble azobis(isobutyramidine) hydrochloride, azobis[2-(2-imidazolin-2-yl)isobutane]hydrochloride, azobis(cyanovaleric acid) or azobis[2-(2-imidazolin-2-yl)propane], the conductive polymer is a mixture of poly(3,4-ethylenedioxythiophene) and poly(sodium-p-styrenesulfonate) in a mass ratio of from 1:2 to 1:6, the solvent for the solution of the conductive polymer is water, and the step of spin-coating the conductive gel and drying comprises dripping the conductive gel on the conductive substrate, spin coating with a spin coater at a rotating speed of 500~3000 rpm, and heating at 150~200° C. for 15~60 min.

Preferably, the azo initiator is amphipathic azoisobutyronitrile formamide, the conductive polymer is a mixture of poly(3,4-ethylenedioxythiophene) and poly(sodium-p-styrenesulfonate) in a mass ratio of from 1:2 to 1:6, poly(3-hexylthiophene), poly(3-methylthiophene), poly(3-octyloxy thiophene) or poly(3-dodecyl thiophene), the solvent for the solution of the conductive polymer is water, benzene, chlorobenzene or xylene; and the step of spin-coating the conductive gel and drying comprises dripping the conductive gel on the conductive substrate, spin coating with a spin coater at a rotating speed of 500~4000 rpm, and heating at 100~200° C. for 15~60 min.

Preferably, the pretreatment step comprises sonicating the conductive substrate sequentially in a detergent, deionized water, acetone, ethanol, and isopropanol, and subjecting the conductive substrate to oxygen plasma treatment, ozone-UV treatment, hydrogen peroxide treatment, aqua regia treatment or acid treatment.

The hole injection layer of the organic electroluminescent device comprises an azo initiator. Since the azo initiator has a relatively low decomposition temperature, it would decompose to release $N_2$ when being heated above its decomposition temperature, so that a layer of non-planar, three-dimensional, nano-reticular structure is formed on the surface of the hole injection layer. This structure can greatly increase the area of the contact interface between the hole injection layer and an adjacent layer, thereby improving the contact between the hole injection layer and the adjacent layer, increasing the hole injection efficiency, and increasing the probability of recombination between holes and electrons, so that the luminescent efficiency and the luminescent brightness of the organic electroluminescent device can be increased.

SPECIFIC EMBODIMENTS

Figure 1:
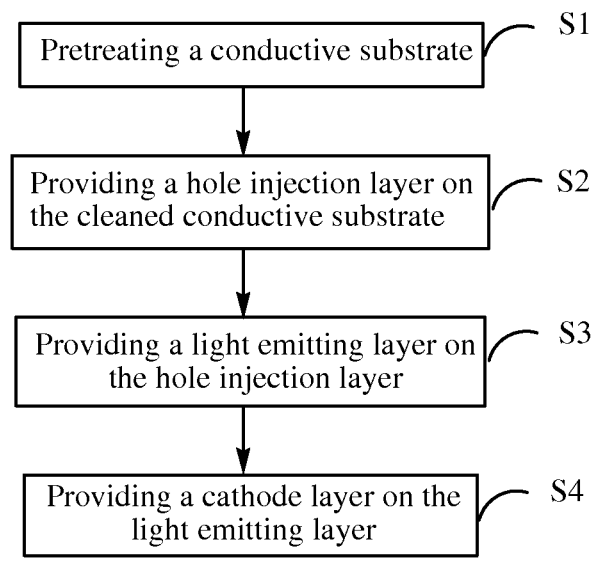
FIG. 1 shows a flow chart of a method for preparing the organic electroluminescent device according to an embodiment.

In conventional organic electroluminescent devices, poor contact between the hole injection layer and an adjacent layer would result in reduction of hole injection efficiency. In respect of this, the applicant inventively introduces an azo initiator during the preparation of the hole injection layer. After heating to a relatively high temperature so that the azo initiator decomposes to release $N_2$, a nano-reticular structure is formed on the surface of the hole injection layer, while the nano-reticular structure results in great increase of the contact area between the hole injection layer and the adjacent layer, improvement of the state of contact between the hole injection layer and the adjacent layer, and increase of the hole injection efficiency.

According to the inventive concept, there is provided an embodiment of the organic electroluminescent device, which comprises a sequentially laminated structure comprising a conductive substrate, a hole injection layer, a light emitting layer and a cathode layer; wherein the hole injection layer comprises an azo initiator and a conductive polymer and has a thickness of 10~50 nm, and the surface of the hole injection layer connecting to the light emitting layer has a nano-reticular structure formed by thermal decomposition of the azo initiator.

A hole transport layer may also be provided between the hole injection layer and the light emitting layer. One of an electron transport layer and an electron injection layer may also be provided between the light emitting layer and the cathode layer. An electron transport layer and an electron injection layer may also be provided between the light emitting layer and the cathode layer, in which the electron transport layer is in contact with the light emitting layer.

As described above, the organic electroluminescent device may have a variety of structures, specifically sequentially laminated conductive substrate, hole injection layer, light emitting layer and cathode layer; sequentially laminated conductive substrate, hole injection layer, light emitting layer, electron transport layer and cathode layer; sequentially laminated conductive substrate, hole injection layer, hole transport layer, light emitting layer, electron injection layer and cathode layer; sequentially laminated conductive substrate, hole injection layer, hole transport layer, light emitting layer, electron transport layer and cathode layer; sequentially laminated conductive substrate, hole injection layer, hole transport layer, light emitting layer, electron transport layer, electron injection layer and cathode layer; or the like.

When the azo initiator is an oil-soluble initiator, the conductive polymer may be an oil-soluble polymer. When the azo initiator is a water-soluble initiator, the conductive polymer may be a water-soluble polymer. When the azo initiator is an amphipathic initiator, i.e. the azo initiator is soluble both in water and in an organic solvent, the conductive polymer may be a water-soluble polymer or an oil-soluble polymer. The specific substances may be listed as follows.

When the azo initiator is oil-soluble azobisisobutyronitrile, the conductive polymer may be poly(3-hexylthiophene), poly(3-methylthiophene), poly(3-octyloxy thiophene) or poly(3-dodecyl thiophene).

When the azo initiator is water-soluble azobis(isobutyramidine) hydrochloride, azobis[2-(2-imidazolin-2-yl)isobutane]hydrochloride, azobis(cyanovaleric acid) or azobis[2-(2-imidazolin-2-yl)propane], the conductive polymer may be a mixture of poly(3,4-ethylenedioxythiophene) and poly(sodium-p-styrenesulfonate) in a mass ratio of from 1:2 to 1:6.

When the azo initiator is amphipathic azoisobutyronitrile formamide, the conductive polymer may be a mixture of poly(3,4-ethylenedioxythiophene) and poly(sodium-p-styrenesulfonate) in a mass ratio of from 1:2 to 1:6, poly(3-hexylthiophene), poly(3-methylthiophene), poly(3-octyloxy thiophene) or poly(3-dodecyl thiophene).

The material for the conductive substrate may be indium tin oxide glass, fluorine-containing tin oxide glass, aluminum-doped zinc oxide, magnesium-indium oxide, nickel-tungsten oxide, metal nitride, metal selenide or metal sulfide.

The material for the cathode layer may be aluminum, gold, magnesium-silver alloy, aluminum-magnesium alloy, aluminum-calcium alloy or aluminum lithium alloy.

The material for the hole transport layer may be N,N'-di(3-methylphenyl)-N,N'-diphenyl-4,4'-biphenyl diamine, poly(p-phenylene vinylene) or a derivative thereof, N,N'-(1-naphthyl)-N,N'-diphenyl-4,4'-biphenyl diamine, 1,3,5-triphenylbenzene, polyvinylcarbazole, phthalocyanine copper or P-type doped inorganic semiconductor.

The material for the light emitting layer may be tetra(tert-butyl)perylene, 4-(dicyano methyl)-2-butyl-6-(1,1,7,7-tetramethyljulolidine-9-vinyl)-4H-pyran, 9,10-di-β-naphthalene anthracene, di(2-methyl-8-hydroxyquinolyl)-(4-diphenol) aluminum, 4-(dicyanomethylene)-2-isopropyl-6-(1,1,7,7-tetramethyljulolidine-9-vinyl)-4H-pyran, dimethyl quinacridone, 8-hydroxyquinoline aluminum or poly(p-phenylene vinylene) or a derivative thereof.

The material for the electron transport layer may be 2-(4-biphenyl)-5-(4-tert-butyl)phenyl-1,3,4-oxadiazole, 8-hydroxyquinoline aluminum, 2,5-di(1-naphthyl)-1,3,4-diazole, 1,2,4-triazole derivative, N-aryl benzimidazole, quinoxaline derivative or n-type doped inorganic semiconductor.

The material for the electron injection layer may be LiF, $LiO_2$, $Cs_2O$, $Al_2O_3$, NaF, CsF, $CaF_2$, $MgF_2$, NaCl, KCl, RbCl, $LiBO_2$ or $K_2SiO_3$.

FIG. 1 shows a method for preparing the above organic electroluminescent device, which comprises the following steps.

S1: Subjecting the conductive substrate to a pretreatment.

A conductive substrate is provided, subjected to a photolithography, sonicated sequentially in a detergent, deionized water, acetone, ethanol and isopropanol, and then subjected to oxygen plasma treatment, ozone-UV treatment, hydrogen peroxide treatment, aqua regia treatment or acid treatment, to complete the pretreatment.

The material for the conductive substrate may be indium tin oxide glass, fluorine-containing tin oxide glass, aluminum-doped zinc oxide, magnesium-indium oxide, nickel-tungsten oxide, metal nitride, metal selenide or metal sulfide.

S2: Forming a hole injection layer on the conductive substrate.

The conductive polymer is dissolved in a suitable solvent to prepare a solution of the conductive polymer.

An azo initiator is added into the solution of the conductive polymer, the mass ratio of the azo initiator and the conductive polymer being in the range of from 0.1:1 to 1.5:1, to prepare a conductive gel.

The above conductive gel is spin coated on the conductive substrate, and oven-dried so that the azo initiator decomposes to form a nano-reticular structure on the surface of the hole injection layer. After cooling, the hole injection layer is formed.

The conductive polymer may be poly(3-hexyl thiophene), poly(3-methylthiophene), poly(3-octyloxy thiophene) or poly(3-dodecylthiophene). Toluene, chlorobenzene or xylene may be used as the solvent to prepare the solution. The concentration of the conductive polymer may be in the range of from $1\times10^{-3}$ to $1\times10^{-2}$ g/L.

When the azo initiator is oil-soluble azobisisobutyronitrile, the conductive polymer may be poly(3-hexylthiophene), poly(3-methylthiophene), poly(3-octyloxy thiophene) or poly(3-dodecyl thiophene); the solvent may be toluene, chlorobenzene or xylene; and the step of spin-coating the conductive gel and drying comprises dripping the conductive gel on the conductive substrate, spin coating with a spin coater at a rotating speed of 500~4000 rpm for 30 s, and heating in an oven at 150~200° C. for 15~60 min.

When the azo initiator is water-soluble azobis(isobutyramidine) hydrochloride, azobis[2-(2-imidazolin-2-yl)isobutane]hydrochloride, azobis(cyanovaleric acid) or azobis[2-(2-imidazolin-2-yl)propane], the conductive polymer may be a mixture of poly(3,4-ethylenedioxythiophene) and poly(sodium-p-styrenesulfonate) in a mass ratio of from 1:2 to 1:6; the solvent may be water; and the step of spin-coating the conductive gel and drying comprises dripping the conductive gel on the conductive substrate, spin coating with a spin coater at a rotating speed of 500~3000 rpm for 30 s, and heating in an oven at 150~200° C. for 15~60 min.

When the azo initiator is amphipathic azoisobutyronitrile formamide, the conductive polymer may be a mixture of poly(3,4-ethylenedioxythiophene) and poly(sodium-p-styrenesulfonate) in a mass ratio of from 1:2 to 1:6, poly(3-hexylthiophene), poly(3-methylthiophene), poly(3-octyloxy thiophene) or poly(3-dodecyl thiophene); the solvent may be water, benzene, chlorobenzene or xylene; and the step of spin-coating the conductive gel and drying comprises dripping the conductive gel on the conductive substrate, spin coating with a spin coater at a rotating speed of 500~4000 rpm for 30 s, and heating in an oven at 100~200° C. for 15~60 min.

S3: Forming a light emitting layer on the hole injection layer.

The emitting layer is formed on the hole injection layer by spin coating, vapor deposition, sputtering, jet plating, chemical vapor deposition or electrochemical deposition.

The material for the light emitting layer may be tetra(tert-butyl)perylene, 4-(dicyano methyl)-2-butyl-6-(1,1,7,7-tetramethyljulolidine-9-vinyl)-4H-pyran, 9,10-di-β-naphthalene anthracene, di(2-methyl-8-hydroxyquinolyl)-(4-diphenol) aluminum, 4-(dicyanomethylene)-2-isopropyl-6-(1,1,7,7-tetramethyljulolidine-9-vinyl)-4H-pyran, dimethyl quinacridone, 8-hydroxyquinoline aluminum or poly(p-phenylene vinylene) or a derivative thereof.

S4: Forming a cathode layer on the light emitting layer.

The cathode layer is formed on the composite light emitting layer by spin coating, vapor deposition, sputtering, jet plating, chemical vapor deposition or electrochemical deposition.

The material for the cathode layer may be aluminum, gold, magnesium-silver alloy, aluminum-magnesium alloy, aluminum-calcium alloy or aluminum lithium alloy.

The above method for preparing the organic electroluminescent device may further comprise forming a hole transport layer between the hole injection layer and the light emitting layer and sequentially forming an electron transport layer and an electron injection layer between the light emitting layer and the cathode layer by spin coating, vapor deposition, sputtering, jet plating, chemical vapor deposition or electrochemical deposition.

The material for the hole transport layer may be N,N'-di(3-methylphenyl)-N,N'-diphenyl-4,4'-biphenyl diamine, poly(p-phenylene vinylene) or a derivative thereof, N,N'-(1-naphthyl)-N,N'-diphenyl-4,4'-biphenyl diamine, 1,3,5-triphenylbenzene, polyvinylcarbazole, phthalocyanine copper or P-type doped inorganic semiconductor.

The material for the electron transport layer may be 2-(4-biphenyl)-5-(4-tert-butyl)phenyl-1,3,4-oxadiazole, 8-hydroxyquinoline aluminum, 2,5-di(1-naphthyl)-1,3,4-diazole, 1,2,4-triazole derivative, N-aryl benzimidazole, quinoxaline derivative or n-type doped inorganic semiconductor.

The material for the electron injection layer may be LiF, $LiO_2$, $Cs_2O$, $Al_2O_3$, NaF, CsF, $CaF_2$, $MgF_2$, NaCl, KCl, RbCl, $LiBO_2$ or $K_2SiO_3$.

The organic electroluminescent device and the method for the preparation thereof are further described hereinafter in combination with specific embodiments. In the following Examples, the material for the hole transport layer is N,N'-di (3-methylphenyl)-N,N'-diphenyl-4,4'-biphenyl diamine (TPD); the material for the light emitting layer is tetra(tert-butyl)perylene (TBP); the material for the electron transport layer material for 2-(4-biphenyl)-5-(4-tert-butyl)phenyl-1,3,4-oxadiazole (PBD); the material for the electron injection layer is LiF; and the material for the cathode layer is Al.

Example 1

Figure 2:
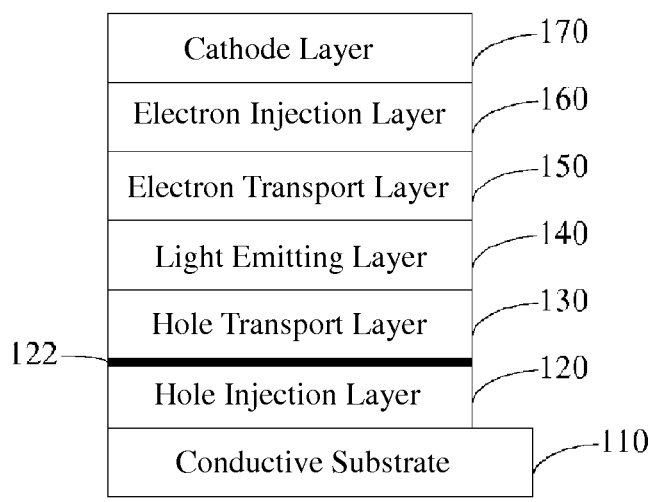
FIG. 2 shows a schematic structure of an organic electroluminescent device according to Example 1.

An organic electroluminescent device is shown in FIG. 2, which comprises a sequentially laminated structure comprising a conductive substrate 110, a hole injection layer 120, a hole transport layer 130, a light emitting layer 140, an electron transport layer 150, an electron injection layer 160 and a cathode layer 170; wherein the surface of the hole injection layer 120 contacting with the hole transport layer 130 has a nano-reticular structure 122. The process for preparing the organic electroluminescent device is as follows.

An indium tin oxide glass is subjected to a photolithographic treatment, cut into desired size, and then sonicated sequentially in a detergent, deionized water, acetone, ethanol and isopropanol, each for 15 min. After cleaning, the conductive glass is subjected to oxygen plasma treatment to further remove organic contaminants from the surface thereof, enhance combination thereof with the organic layer, increase the surface work function thereof, and thus increase the hole injection capability. Azobisisobutyronitrile (AIBN) is added to a solution of poly(3-hexyl thiophene) (P3HT) in chlorobenzene (in which the concentration of poly(3-hexyl thiophene) is $1 \times 10^{-3}$ g/L), wherein the mass ratio of azobisisobutyronitrile (AIBN) to poly(3-hexyl thiophene) (P3HT) is 1:1. The prepared solution is dripped on a spin coater and spin coated on the conductive glass at a rotating speed of 500~4000 rpm for 30 s. The coated conductive glass is then heated in an oven at 200° C. for 40 min. After drying, the hole injection layer is obtained, onto which the hole transport layer, the light emitting layer and the electron transport layer are prepared by thermal vapor deposition, and then the electron injection layer and the cathode layer are prepared by vapor deposition. Finally, the desired organic electroluminescent device is obtained.

A traditional organic electroluminescent device is prepared, in which a water-soluble hole injection layer is spin coated and heated to evaporate completely the solvent therein, an oil-soluble hole transport layer is then applied by spin coating or vapor deposition, and other operations are the same as those in Example 1. In the traditional organic electroluminescent device, there is an obvious boundary at the interface between the hole injection layer and the hole transport layer.

The hole injection layer of the organic electroluminescent device prepared in Example 1 comprises azobisisobutyronitrile (AIBN) which is liable to decompose. AIBN has a low decomposition temperature which is at about 70° C. Due to the thermal decomposition, N atoms having a relatively large volume are released from the hole injection layer in the form of $N_2$, so that a non-planar, three-dimensional, nano-reticular structure on the surface of the hole injection layer. This structure significantly increases the contact area between the hole injection layer and the hole transport layer, which, on one hand, increases the hole injection efficiency, and, on the other hand, shortens the distance for the holes to reach the active layer, increases the recombination probability, and facilitates the improvement of the luminescent intensity and the luminescent brightness.

Example 2

Figure 3:
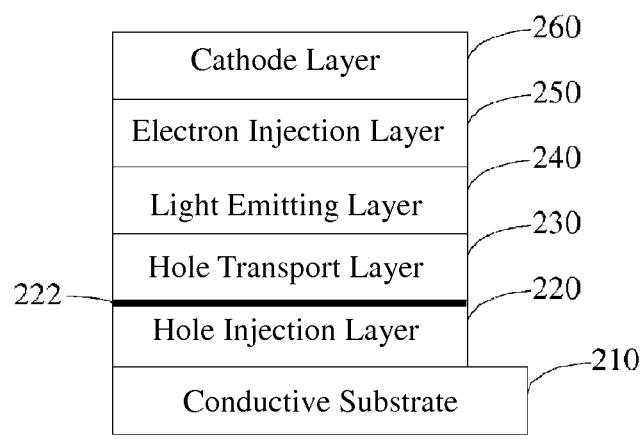
FIG. 3 shows a schematic structure of an organic electroluminescent device according to Example 2.

An organic electroluminescent device is shown in FIG. 3, which comprises a sequentially laminated structure comprising a conductive substrate 210, a hole injection layer 220, a hole transport layer 230, a light emitting layer 240, an electron injection layer 250 and a cathode layer 260; wherein the surface of the hole injection layer 220 contacting with the hole transport layer 230 has a nano-reticular structure 222. The process for preparing the organic electroluminescent device is as follows.

An indium tin oxide glass is subjected to a photolithographic treatment, cut into desired size, and then sonicated sequentially in a detergent, deionized water, acetone, ethanol and isopropanol, each for 15 min. After cleaning, the conductive glass is subjected to oxygen plasma treatment to further remove organic contaminants from the surface thereof, enhance combination thereof with the organic layer, increase the surface work function thereof, and thus increase the hole injection capability. Azobisisobutyronitrile (AIBN) is added to a solution of poly(3-hexyl thiophene) (P3HT) in chlorobenzene (in which the concentration of poly(3-hexyl thiophene) is $5 \times 10^{-3}$ g/L), wherein the mass ratio of azobisisobutyronitrile (AIBN) to poly(3-hexyl thiophene) (P3HT) is 0.5:1. The prepared solution is dripped on a spin coater and spin coated on the conductive glass at a rotating speed of 500~4000 rpm for 30 s. The coated conductive glass is then heated in an oven at 200° C. for 40 min. After drying, the hole injection layer is obtained, onto which the hole transport layer and the light emitting layer are prepared by thermal vapor deposition, and then the electron injection layer and the cathode layer are prepared by vapor deposition. Finally, the desired organic electroluminescent device is obtained.

Example 3

An indium tin oxide glass is subjected to a photolithographic treatment, cut into desired size, and then sonicated sequentially in a detergent, deionized water, acetone, ethanol and isopropanol, each for 15 min. After cleaning, the conductive glass is subjected to oxygen plasma treatment to further remove organic contaminants from the surface thereof, enhance combination thereof with the organic layer, increase the surface work function thereof, and thus increase the hole injection capability. Azobisisobutyronitrile (AIBN) is added to a solution of poly(3-hexyl thiophene) (P3HT) in chlorobenzene (in which the concentration of poly(3-hexyl thiophene) is $5 \times 10^{-3}$ g/L), wherein the mass ratio of azobisisobutyronitrile (AIBN) to poly(3-hexyl thiophene) (P3HT) is 1.5:1. The prepared solution is dripped on a spin coater and spin coated on the conductive glass at a rotating speed of 500~4000 rpm for 30 s. The coated conductive glass is then heated in an oven at 200° C. for 40 min. After drying, the hole injection layer is obtained, onto which the hole transport layer, the light emitting layer and the electron transport layer are prepared by thermal vapor deposition, and then the electron injection layer and the cathode layer are prepared by vapor deposition. Finally, the desired organic electroluminescent device is obtained.

Example 4

An indium tin oxide glass is subjected to a photolithographic treatment, cut into desired size, and then sonicated sequentially in a detergent, deionized water, acetone, ethanol and isopropanol, each for 15 min. After cleaning, the conductive glass is subjected to oxygen plasma treatment at a power of 10~50 W for 5~15 min. Azo(biscyanovaleric acid) (ACVA) is added to an aqueous solution of a mixture of poly(3,4-ethylenedioxythiophene) and poly(sodium-p-styrenesulfonate) in a mass ratio of 1:2, wherein the mass ratio of azo(biscyanovaleric acid) (ACVA) to the mixture of poly(3,4-ethylenedioxythiophene) and poly(sodium-p-styrenesulfonate) in a mass ratio of 1:2 is 1:1. The prepared solution is dripped on a spin coater and spin coated on the conductive glass at a rotating speed of 500~3000 rpm for 30 s. The coated conductive glass is then heated in an oven at 200° C. for 30 min. After drying, the hole injection layer is obtained, onto which the hole transport layer, the light emitting layer and the electron transport layer are prepared by thermal vapor deposition, and then the electron injection layer and the cathode layer are prepared by vapor deposition. Finally, the desired organic electroluminescent device is obtained.

Example 5

An indium tin oxide glass is subjected to a photolithographic treatment, cut into desired size, and then sonicated sequentially in a detergent, deionized water, acetone, ethanol and isopropanol, each for 15 min. After cleaning, the conductive glass is subjected to oxygen plasma treatment at a power of 10~50 W for 5~15 min. Azo(biscyanovaleric acid) (ACVA) is added to an aqueous solution of a mixture of poly(3,4-ethylenedioxythiophene) and poly(sodium-p-styrenesulfonate) in a mass ratio of 1:6, wherein the mass ratio of azo(biscyanovaleric acid) (ACVA) to the mixture of poly(3,4-ethylenedioxythiophene) and poly(sodium-p-styrenesulfonate) in a mass ratio of 1:6 is 1:1. The prepared solution is dripped on a spin coater and spin coated on the conductive glass at a rotating speed of 500~3000 rpm for 30 s. The coated conductive glass is then heated in an oven at 200° C. for 30 min. After drying, the hole injection layer is obtained, onto which the hole transport layer, the light emitting layer and the electron transport layer are prepared by thermal vapor deposition, and then the electron injection layer and the cathode layer are prepared by vapor deposition. Finally, the desired organic electroluminescent device is obtained.

Example 6

An indium tin oxide glass is subjected to a photolithographic treatment, cut into desired size, and then sonicated sequentially in a detergent, deionized water, acetone, ethanol and isopropanol, each for 15 min. After cleaning, the conductive glass is subjected to oxygen plasma treatment at a power of 10~50 W for 5~15 min. Azo(biscyanovaleric acid) (ACVA) is added to an aqueous solution of a mixture of poly(3,4-ethylenedioxythiophene) and poly(sodium-p-styrenesulfonate) in a mass ratio of 1:2, wherein the mass ratio of azo(biscyanovaleric acid) (ACVA) to the mixture of poly(3,4-ethylenedioxythiophene) and poly(sodium-p-styrenesulfonate) in a mass ratio of 1:2 is 0.5:1. The prepared solution is dripped on a spin coater and spin coated on the conductive glass at a rotating speed of 500~3000 rpm for 30 s. The coated conductive glass is then heated in an oven at 200° C. for 30 min. After drying, the hole injection layer is obtained, onto which the hole transport layer, the light emitting layer and the electron transport layer are prepared by thermal vapor deposition, and then the electron injection layer and the cathode layer are prepared by vapor deposition. Finally, the desired organic electroluminescent device is obtained.

Example 7

An indium tin oxide glass is subjected to a photolithographic treatment, cut into desired size, and then sonicated sequentially in a detergent, deionized water, acetone, ethanol and isopropanol, each for 15 min. After cleaning, the conductive glass is subjected to oxygen plasma treatment at a power of 10~50 W for 5~15 min. Azoisobutyronitrile formamide (CABN) is added to a solution of poly(3-hexyl thiophene) (P3HT) in chlorobenzene (in which the concentration of poly (3-hexyl thiophene) is $1 \times 10^{-3}$ g/L), wherein the mass ratio of azoisobutyronitrile formamide (CABN) to poly(3-hexyl thiophene) (P3HT) is 1:1. The prepared solution is dripped on a spin coater and spin coated on the conductive glass at a rotating speed of 500~4000 rpm for 30 s. The coated conductive glass is then heated in an oven at 200° C. for 40 min. After drying, the hole injection layer is obtained, onto which the hole transport layer, the light emitting layer and the electron transport layer are prepared by thermal vapor deposition, and then the electron injection layer and the cathode layer are prepared by vapor deposition. Finally, the desired organic electroluminescent device is obtained.

Example 8

An indium tin oxide glass is subjected to a photolithographic treatment, cut into desired size, and then sonicated sequentially in a detergent, deionized water, acetone, ethanol and isopropanol, each for 15 min. After cleaning, the conductive glass is subjected to oxygen plasma treatment at a power of 10~50 W for 5~15 min. Azoisobutyronitrile formamide (CABN) is added to an aqueous solution of a mixture of poly(3,4-ethylenedioxythiophene) and poly(sodium-p-styrenesulfonate) in a mass ratio of 1:6, wherein the mass ratio of azoisobutyronitrile formamide (CABN) to the mixture of poly(3,4-ethylenedioxythiophene) and poly(sodium-p-styrenesulfonate) in a mass ratio of 1:6 is 1:1. The prepared solution is dripped on a spin coater and spin coated on the conductive glass at a rotating speed of 500~4000 rpm for 30 s. The coated conductive glass is then heated in an oven at 200° C. for 40 min. After drying, the hole injection layer is obtained, onto which the hole transport layer, the light emitting layer and the electron transport layer are prepared by thermal vapor deposition, and then the electron injection layer and the cathode layer are prepared by vapor deposition. Finally, the desired organic electroluminescent device is obtained.

Example 9

An indium tin oxide glass is subjected to a photolithographic treatment, cut into desired size, and then sonicated sequentially in a detergent, deionized water, acetone, ethanol and isopropanol, each for 15 min. After cleaning, the conductive glass is subjected to oxygen plasma treatment at a power of 10~50 W for 5~15 min. Azoisobutyronitrile formamide (CABN) is added to an aqueous solution of a mixture of poly(3,4-ethylenedioxythiophene) and poly(sodium-p-styrenesulfonate) in a mass ratio of 1:4, wherein the mass ratio of azoisobutyronitrile formamide (CABN) to the mixture of poly(3,4-ethylenedioxythiophene) and poly(sodium-p-styrenesulfonate) in a mass ratio of 1:4 is 1:1. The prepared solution is dripped on a spin coater and spin coated on the conductive glass at a rotating speed of 500~4000 rpm for 30 s. The coated conductive glass is then heated in an oven at 200° C. for 40 min. After drying, the hole injection layer is obtained, onto which the hole transport layer, the light emitting layer and the electron transport layer are prepared by thermal vapor deposition, and then the electron injection layer and the cathode layer are prepared by vapor deposition. Finally, the desired organic electroluminescent device is obtained.

The above Examples illustrate only several embodiments of the present invention, and the description is specific and in detail. However, this can not be understood as a limitation to the scope of the present invention. It should be noted that, for a person having ordinary skill in the art, certain modifications and improvements may be made without departing from the inventive concept, which shall be within the scope sought protection in the present invention. Therefore, the scope sought protection in the present invention should be subject to the appended claims.

What is claimed is:

1. An organic electroluminescent device, comprising a sequentially laminated structure comprising a conductive substrate, a hole injection layer, a light emitting layer and a cathode layer; wherein the hole injection layer comprises a conductive polymer and an azo initiator, and the surface of the hole injection layer connecting to the light emitting layer has a nano-reticular structure formed by thermal decomposition of the azo initiator.

2. The organic electroluminescent device according to claim 1, wherein the organic electroluminescent device further comprises a hole transport layer between the hole injection layer and the light emitting layer, and the surface of the hole injection layer connecting to the hole transport layer has a nano-reticular structure formed by thermal decomposition of the azo initiator.

3. The organic electroluminescent device according to claim 1, wherein the organic electroluminescent device further comprises an electron transport layer or an electron injection layer between the light emitting layer and the cathode layer.

4. The organic electroluminescent device according to claim 1, wherein the organic electroluminescent device further comprises an electron transport layer and an electron injection layer between the light emitting layer and the cathode layer, and the electron transport layer is in contact with the light emitting layer.

5. The organic electroluminescent device according to claim 1, wherein:
the azo initiator is oil-soluble azobisisobutyronitrile, and the conductive polymer is poly(3-hexylthiophene), poly(3-methylthiophene), poly(3-octyloxythiophene) or poly(3-dodecylthiophene); or
the azo initiator is water-soluble azobis(isobutyramidine) hydrochloride, azobis[2-(2-imidazolin-2-yl)isobutane] hydrochloride, azobis(cyanovaleric acid) or azobis[2-(2-imidazolin-2-yl)propane], and the conductive polymer is a mixture of poly(3,4-ethylenedioxythiophene) and poly(sodium-p-styrenesulfonate) in a mass ratio of from 1:2 to 1:6; or
the azo initiator is amphipathic azoisobutyronitrile formamide, and the conductive polymer is a mixture of poly(3,4-ethylenedioxythiophene) and poly(sodium-p-styrenesulfonate) in a mass ratio of from 1:2 to 1:6, poly(3-hexylthiophene), poly(3-methylthiophene), poly(3-octyloxy thiophene) or poly(3-dodecyl thiophene).

6. The organic electroluminescent device according to claim 5, wherein the organic electroluminescent device further comprises a hole transport layer between the hole injection layer and the light emitting layer, and the surface of the hole injection layer connecting to the hole transport layer has a nano-reticular structure formed by thermal decomposition of the azo initiator.

7. The organic electroluminescent device according to claim 5, wherein the organic electroluminescent device further comprises an electron transport layer or an electron injection layer between the light emitting layer and the cathode layer.

8. The organic electroluminescent device according to claim 5, wherein the organic electroluminescent device further comprises an electron transport layer and an electron injection layer between the light emitting layer and the cathode layer, and the electron transport layer is in contact with the light emitting layer.

9. A method for preparing an organic electroluminescent device, comprising the steps of:
adding an azo initiator into a solution of a conductive polymer and stirring to prepare a conductive gel, wherein a mass ratio of the azo initiator and the conductive polymer is in a range of from 0.1:1 to 1.5:1;
subjecting a surface of a conductive substrate to a pretreatment;
spin-coating the conductive gel on the pretreated surface of the conductive substrate and drying to give a hole injection layer;
providing a light emitting layer on the hole injection layer; and
providing a cathode layer on the light emitting layer and drying to give the organic electroluminescence device.

10. The method for preparing an organic electroluminescent device according to claim 9, wherein the azo initiator is oil-soluble azobisisobutyronitrile, the conductive polymer is poly(3-hexylthiophene), poly(3-methylthiophene), poly(3-octyloxy thiophene) or poly(3-dodecyl thiophene), the solvent for the solution of the conductive polymer is toluene, chlorobenzene or xylene, and the step of spin-coating the conductive gel and drying comprises dripping the conductive gel on the conductive substrate, spin coating with a spin coater at a rotating speed of 500~4000 rpm, and heating at 150~200° C. for 15~60 min.

11. The method for preparing an organic electroluminescent device according to claim 9, wherein the azo initiator is water-soluble azobis(isobutyramidine) hydrochloride, azobis[2-(2-imidazolin-2-yl)isobutane]hydrochloride, azobis(cyanovaleric acid) or azobis[2-(2-imidazolin-2-yl)propane], the conductive polymer is a mixture of poly(3,4-ethylenedioxythiophene) and poly(sodium-p-styrenesulfonate) in a mass ratio of from 1:2 to 1:6, the solvent for the solution of the conductive polymer is water, and the step of spin-coating the conductive gel and drying comprises dripping the conductive gel on the conductive substrate, spin coating with a spin coater at a rotating speed of 500~3000 rpm, and heating at 150~200° C. for 15~60 min.

12. The method for preparing an organic electroluminescent device according to claim 9, wherein the azo initiator is amphipathic azoisobutyronitrile formamide, the conductive polymer is a mixture of poly(3,4-ethylenedioxythiophene) and poly(sodium-p-styrenesulfonate) in a mass ratio of from 1:2 to 1:6, poly(3-hexylthiophene), poly(3-methylthiophene), poly(3-octyloxy thiophene) or poly(3-dodecyl thiophene), the solvent for the solution of the conductive polymer is water, benzene, chlorobenzene or xylene; and the step of spin-coating the conductive gel and drying comprises dripping the conductive gel on the conductive substrate, spin coating with a spin coater at a rotating speed of 500~4000 rpm, and heating at 100~200° C. for 15~60 min.

13. The method for preparing an organic electroluminescent device according to claim 9, wherein the pretreatment step comprises sonicating the conductive substrate sequentially in a detergent, deionized water, acetone, ethanol, and isopropanol, and subjecting the conductive substrate to oxygen plasma treatment, ozone-UV treatment, hydrogen peroxide treatment, aqua regia treatment or acid treatment.

* * * * *